(12) United States Patent
Mehta et al.

(10) Patent No.: US 8,005,638 B1
(45) Date of Patent: Aug. 23, 2011

(54) DISTRIBUTED TEST SYSTEM AND METHOD

(75) Inventors: Naresh U. Mehta, Santa Clara, CA (US); Parmeshwar Roddy Bayappu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 62 days.

(21) Appl. No.: 11/877,052

(22) Filed: Oct. 23, 2007

(51) Int. Cl.
*G01L 23/08* (2006.01)

(52) U.S. Cl. ......... 702/121; 702/116; 702/118; 702/122

(58) Field of Classification Search ............... 702/77, 702/85, 108, 117, 183, 185; 701/203; 710/52; 714/727, 742
See application file for complete search history.

(56) References Cited

U.S. PATENT DOCUMENTS

| | | | | |
|---|---|---|---|---|
| 6,625,785 | B2 * | 9/2003 | Chatterjee et al. ................ | 716/4 |
| 6,882,947 | B2 * | 4/2005 | Levin ............................. | 702/77 |
| 7,113,883 | B1 * | 9/2006 | House et al. ................ | 702/122 |
| 2007/0100586 | A1 * | 5/2007 | Cheng et al. ................ | 702/185 |
| 2008/0126903 | A1 * | 5/2008 | Wegener ....................... | 714/742 |
| 2008/0256406 | A1 * | 10/2008 | Arnold .......................... | 714/727 |

* cited by examiner

*Primary Examiner* — Michael P Nghiem
*Assistant Examiner* — Felix E Suarez
(74) *Attorney, Agent, or Firm* — Martine Penilla & Gencarella, LLP

(57) ABSTRACT

Provided is a distributed test system and method for electrical devices that features bifurcated testing and analysis of test results for electrical devices by aggregating test results from multiple testing systems to a centralized server where analysis of test data is undertaken. The system includes a plurality of testing systems, each of which is configured to operate test software to provide electrical stimuli to devices under test (DUTs) and obtain measured metrics indicative of actual operational characteristics (AOCs) of the DUTs. A decision support system (DSS) is selectively placed in data communication with the plurality of testing systems to receive the measured metrics from each of the plurality of testing systems. The DSS is configured to operate on software and compare desired metrics, indicative of desired operational characteristics (DOCs) of each of the DUTs, with the measured metrics and provide a plurality of operational characteristic determinations (OCDs).

20 Claims, 2 Drawing Sheets

DISTRIBUTED TEST SYSTEM AND METHOD

BACKGROUND

This invention relates to configuration and management techniques for integrated circuit test environments. More particularly, the invention relates to methods and apparatuses for a test management system and method in integrated circuit test environments employing automated test equipment (ATE).

Typically, integrated circuits (ICs) are subjected to a variety of tests after fabrication to determine whether the same exhibits satisfactory operational characteristics. The operational characteristics of the ICs are analyzed before being segmented from the wafer upon which the same is formed, referred to as preliminary testing. Preliminary testing usually occurs immediately after fabrication of the ICs on the wafer. Additionally, the operational characteristics of ICs are tested after segmentation and before packaging and after packaging, as well. Thereafter packaging tests usually occur right before shipment to an end-user and is referred to as a Final Test.

Measurement of the operational characteristics of ICs constitutes a significant cost factor when manufacturing ICs. To minimize the costs incurred when production testing ICs, attempts are frequently made to automate the same using automatic test equipment (ATE). The ATE applies stimuli, e.g., electrical signals, to the IC, referred to as the device under test (DUT) and checks responses to the stimuli, e.g., currents and voltages, of the DUT. Typically, the end results of a test is either "pass" if the device successfully provides certain expected responses within pre-established tolerances, or "fail" if the device does not provide the expected responses within the pre-established tolerances.

More sophisticated ATE is capable of evaluating a failed device to potentially determine one or more causes of the failure. To that end, it is common for an ATE to include a computer that directs the operation of the ATE. Typically, the computer runs one or more specialized software programs to provide (i) a test development environment and (ii) a device testing environment. In the test development environment a user typically creates a test program, i.e., a software-based construct of one or more files that controls various portions of the ATE. In the device testing environment, the user typically provides the ATE with one or more devices for testing, and directs the ATE to test each device in accordance with the test program. The user can test additional devices by simply providing the additional devices to the ATE, and directing the ATE to test the additional devices in accordance with the test program. Accordingly, the ATE enables the user to test many devices in a consistent and automated manner based on the test program. Prior art attempts have been disclosed to improve the efficiency of ATE performance when characteristic testing of ICs.

U.S. Pat. No. 7,113,883 to House et al. discloses enterprise test configuration and data management systems and associated methods are disclosed for test, measurement and automation environments that allow management, configuration and analysis of test systems and associated data across enterprise-wide test operations. These systems and methods are directed to the production process from the test and test station point of view and provides a variety of mechanisms for test configuration and data management for the ATE including the capability of managing data about each test station, hardware resources, software resources, test configuration, test steps, acquired measurements, test execution, and/or other information related to the tests, the test stations or the units-under-test (UUT). Standardized interfaces are also contemplated for the test station (or ATE) software to communicate with server systems and other ATE if needed, thereby greatly simplifying the coding required for these systems and allowing each test station (or ATE) to talk through the same standardized interface.

Thus, there is a need for improved performance characteristic test techniques for ICs.

SUMMARY OF THE INVENTION

Provided is a distributed test system and method for electrical devices that features bifurcated testing and analysis of test results for electrical devices by aggregating test results from multiple testing systems to a centralized server where analysis of test data is undertaken. To that end, the system includes a plurality of testing systems, each of which is configured to operate test software to provide electrical stimuli to devices under test (DUTs) and obtain measured metrics indicative of actual operational characteristics (AOCs) of the DUTs. A decision support system (DSS) is selectively placed in data communication with the plurality of testing systems to receive the measured metrics from each of the plurality of testing systems. The DSS is configured to operate on software and compare desired metrics, indicative of desired operational characteristics (DOCs) of each of the DUTs, with the measured metrics and provide a plurality of operational characteristic determinations (OCDs). Benefits of this system include undertaking testing of DUTS while manipulation of the desired metrics to normalize the AOC of DUTs so as to compensate for variations in test equipment, ambient conditions and the like. Theses and other embodiments of the present invention are described more fully below.

BRIEF DESCRIPTION OF THE DRAWINGS

The present invention can be best understood by reference to the following description taken in conjunction with the accompanying figures, in which like parts may be referred to by like numerals.

DETAILED DESCRIPTION OF THE INVENTION

Figure 1:
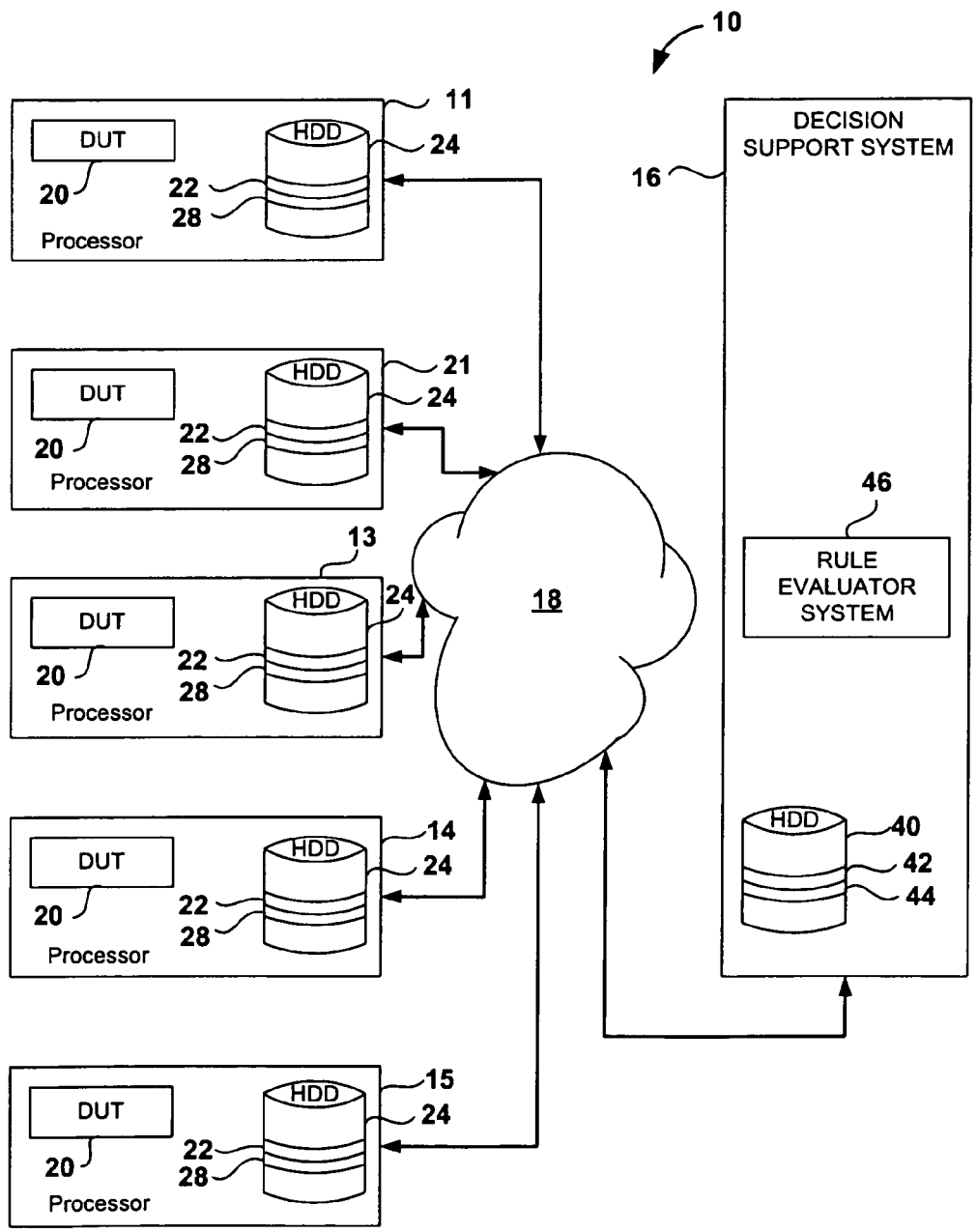
FIG. 1 is simplified plan view of a test management system in accordance with the present invention.

Referring to FIG. 1, an example of a test management system (TMS) 10 is shown as including one or more testing systems 11, 12, 13, 14 and 15 and a server infrastructure referred to as a decision support system (DSS) 16. TMS 10 is structured to facilitate communication, over a network 18, between testing systems 11-15 and DSS 16. As a result, network 18 may be any communication network known, including a local area network (LAN), a metropolitan network (MAN) and/or a wide area network (WAN), such as the Internet, or any combination of these. Each of testing systems 11-15 is configured to provide electrical stimuli to a device under test (DUT) 20. To that end, each of testing systems 11-5 includes computer-readable data, such as a test program 22, stored on a computer-readable storage device, such as a hard diskette drive (HDD) 24. A general processor 26 operates on test program 22 to cause testing systems 11-15 to produce the electrical stimuli. In response, test result data, referred to as measured metrics 28, is produced by testing systems 11-15. Measured metrics 28 are indicative of the actual operational characteristics (AOCs) of DUT 20.

Selectively placed in data communication with any one or more of testing units 11-15 is a central server, referred to as decision support system (DSS) 16. DSS 16 receives measured metrics 28 from one or more of testing systems 11-15. DSS 16 includes computer-readable instructions, such as software 42 stored on HDD 40, to compare measured metrics 28 to desired metrics 44. Desired metrics 44 are indicative of desired operational characteristics (DOC) of each of DUT 20 tested by testing systems 11-15. The comparison of desired metrics 44 with measured metrics 28 provides an operational characteristic determinations (OCDs). The OCDs facilitate determining whether a particular DUT 20 has demonstrated satisfactory AOCs and, therefore, suitable for shipment to an end user.

DSS 16 allows centralized management of determining AOCs for DUTs 20 from amongst a plurality of testing systems 11-15 over network 18. To that end, DSS 16 allows management of testing operations amongst testing systems 11-15 including test input parameters, test result data, testing system information, test configuration information, data management information or any other desired test operations related information. This may be achieved through an interface that may be Internet-based access through a web browser (not shown) and a graphical user interface (not shown).

A user of DSS 16 may communicate with testing systems 11-15 and introduce the software required to determine AOCs of DUTs 20. Additionally, DSS 16 may manage and monitor test operations without interfering with the actual testing of DUTs 20 by testing stations 11-15. For example, measured metrics 28 may be stored remotely with respect to testing systems 11-15 and compared and analyzed with respect to desired metrics 44 to determine the OCDs of DUTs 20 and without interference with ongoing tests of testing systems 11-15. Desired metrics 44 may be modified to compensate for, or take into consideration, intrinsic anomalies presented by testing systems 11-15 without interfering with acquisition of additional measured metrics from testing systems 11-15. As a result, it is possible to normalize measured metrics from testing systems 11-15 that may be contained in a common building or located in different geographical regions of the world, e.g., remotely with respect to where the test occurs. For example, testing systems 11-12 may be located in North America, testing systems 13-14 may be located in Asia and testing system 15 may be located in Europe, Africa, Australia or the like. DSS 16 facilitates obtaining measured metrics 28 from disparate test operations and testing systems 11-15 and the storing, remotely, of measured metrics 28 to provide efficient management and analysis thereof.

An additional benefit provided by centralized location of measured metrics 28 from testing systems 11-15 is that same may be organized in any logical manner to render useful information from measured metrics 28. To that end, testing systems 11-15 are registered to communicate with DSS 16, e.g., configuration information, environmental information and historical information concerning past measured metrics may be included on DSS 16. An example of configuration information includes a unique identifier of testing systems 11-15, network settings, test program version, such as program name, author, last modified, available test stations, etc, as well as execution specific configuration information, e.g., test start time, test end time, calibration at execution and the like. An example of environmental information includes geographic location, building location and operations information concerning the building, department responsibility, weather reports, utility reports and the like. Historical information may include a database of past DUTs and any systemic anomalies identified among measured metrics of the past DUTs. It should be noted that configuration and environmental information and historical information may be updated as appropriate, either locally or remotely through DSS 16. Furthermore, changes may be made, remotely, to the test program of testing systems 11-15 via DSS 16. These changes may be undertaken ad-hoc or in accordance with an established schedule.

To facilitate collection and analysis of measured metrics 28, DSS 16 includes a Rules Evaluator System (RES) 46. RES 46 operates to provide flexibility in the type of information that may be ascertained from measured metrics, and/or configuration information, environmental information and historical information to determine the actual operating characteristics of DUTs 20. For example, RES 46 may compare measured metrics from one of testing systems 11-15, operating on software 42, and compare measured metrics 28 with the remaining testing systems 11-15 to determine whether the measured metrics 28 from the one of testing systems 11-15 matches that of the remaining testing systems 11-15. Additionally, information concerning the past DUTs 20 for which one of testing systems 11-15 has provided information might be indicative of an intrinsic operational characteristic of the one of test systems 11-15, which may be identified by RES 46 as a false indication of a failure mode for DUT 20. Conversely, RES 46 may identify false passing modes based upon a similar analysis. It should be borne in mind that many other comparisons may be undertaken to avoid incorrectly determining that a DUT 20 has demonstrated satisfactory AOCs, i.e., passed or has not demonstrated satisfactory AOCs, i.e., failed.

An advantage provided with DSS 16 is that the analysis of measured metrics 28 may be undertaken without using the computational resources of testing systems 11-15. This becomes advantageous when RES 46 compensates for anomalies intrinsic to a sub-group of testing systems 11-15, i.e., normalize the measurements between testing systems 11-15. As a result, RES 46 may be required to modify the desired operational characteristics of DUTs 20 so as to provide accurate operational characteristic determinations (OCDs). The anomalies for which RES 46 compensates may be due to information garnered concerning the environmental circumstances in which testing systems 11-15 are situated. For example, measured metrics 28 may include information indicating a failure mode of DUTs 20; however, the DSS 16 may have information concerning fluctuations in power supplied to testing units 11-15 that may have contributed to the measured metrics 28 indicating that AOCs of DUTs 20 are not satisfactory. To compensate for the power fluctuation, RES 46 would modify the desired metrics 40 so that OCDs would not incorrectly identify DUTs 20 as providing unsatisfactory AOCs. This may occur, for example, by comparing measured metrics 28 from a sub-set of testing systems 11-15 with the remaining testing systems 11-15 and identifying a common failure mode for DUTs 20 associated with the sub-set of testing systems 11-15. RES 46 would then identify any intrinsic anomalies concerning the environment in which the sub-set of testing systems 11-15 is located. The analysis of all measured metrics 28 from testing systems 11-15 may be achieved remotely with respect to testing systems 11-15 by RES 46 of DSS 16. As a result, there is little or no interference with the testing operations by testing systems 11-15 while the desired operational characteristics of DUTs 20 are modified to produce accurate OCDs of DUTs 20.

To maximize the operations of DSS 16, RES 46 may be configured to provide an analysis in response to an occurrence one or more particular events from testing systems 11-15. For example, RES 46 may be configured to analyze measured metrics 28 from one of testing systems 11-15, in this instance, testing system 11, only upon an occurrence of a specified number of DUTs 20 being tested. It may be that all of DUTs 20 of testing system 11 have been tested indicating that measured metrics 28 for a complete batch have been obtained. Alternatively, it may be that the entire batch of DUTs 20 has been divided among testing systems 11-12 and 15. As a result, only upon completion of testing of DUTs 20 at all three testing systems 11-12 and 15 will the particular event occur that will initiate analysis of measured metrics 28 from testing systems 11-12 and 15 by RES 46.

In response, DSS 16 produces a notification that the particular event has occurred that would initiate analysis by RES 46. For example, a physically perceivable audio or visual notification may occur. Alternatively, or in addition thereto, an e-mail message may be transmitted to an operator of DSS 16, e.g., a production engineer. Regardless of the manner of notification, RES 46 facilitates the production engineer defining the particular event and manner for which notification will be received. For example, the production engineer may establish, as a notification event, a pre-determined number of failures and/or the occurrence of failure of a particular test. Additionally, measured metrics 28 collected may be based upon a selection of tests performed, e.g., only those measured metrics 28 associated with the failed results are transmitted to DSS 16 and analyzed by RES 46. In addition, events can be configured, enabled and disabled so that if the one or more particular events occur, DSS 16 executes a pre-assigned task, such as a notification to a responsible engineer when a test parameter meets some defined condition, such as the test parameter being equal to a selected value, the parameter being over or under a certain range, etc. The event definition of the particular event may be provided to testing systems 11-15 remotely via DSS 16 or locally. Additionally, in respect to the occurrence of the particular event, DSS 16 can modify the test to which DUTs 20 are subject and/or the order of test dynamically. This avoids having to modify the entire testing program executing by testing systems 11-15.

Figure 2:
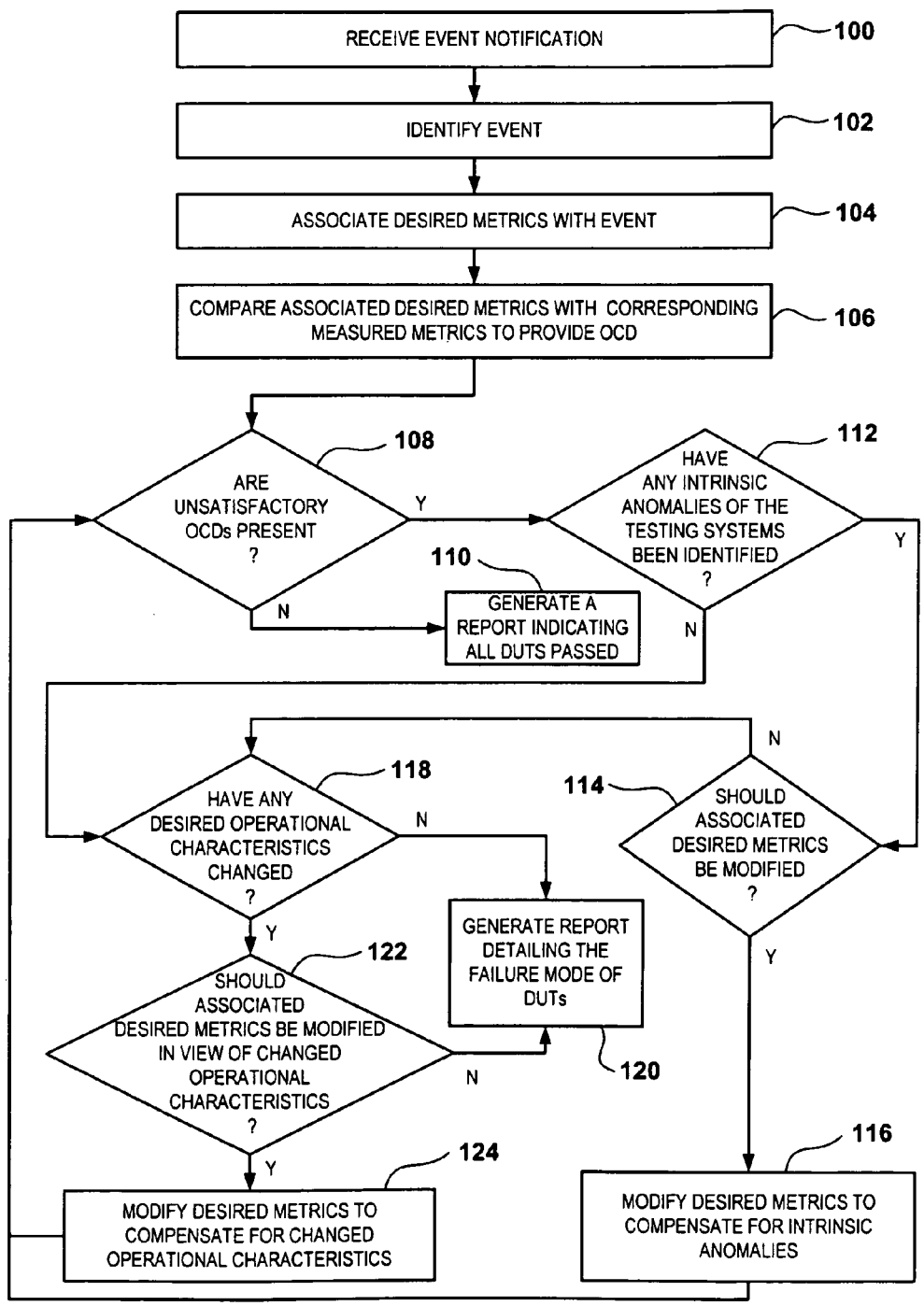
FIG. 2 is a flow chart showing the operations of the test management system shown in FIG. 1.

Referring to both FIGS. 1 and 2, during operation DSS 16 receives notification of an event at function 100. The notification of the particular event occurring, event notification, would be generated by one or more of testing systems 11-15 and include information identifying the testing equipment that transmitted the notification. In addition, the event notification would include measured metrics 28 of DUTs 20 that were tested by the testing system 11-15 that generated the one or more particular events. At function 102, DSS 16 identifies the one or more particular events. At function 104, DSS associates desired metrics 40 from HDD corresponding to measured metrics 28 included in the event notification. At function 106, RES 46 compares measured metrics 28 with the corresponding desired metrics to produce a plurality of OCDs. At function 108 RES 46 determines if any unsatisfactory OCDs are present. If not, a report is generated at function 110. The report indicates all DUTs 20 tested by testing systems 11-15 that generated the events have satisfactory operational characteristics, i.e., the DUTs passed. The report may be expressed in any suitable form for appropriate process, hardcopy, computer-readable copy, optical copy and the like. For example, the report may be rendered for processing by DSS 16, the testing system 11-15 that generated the report, the operator running the test system 11-15, and/or any other testing system 11-15 included in TMS 10. In short, the report may be used in any manner desired for further processing and analysis of the AOCs of DUTs 20.

Otherwise, at function 112 it is determined whether any intrinsic anomalies of the testing systems 11-15 have been identified. If so, it is determined whether any of the associated desired metrics 44 should be modified, at function 114. For example, were it found that intrinsic anomalies identified at function would affect some of the desire metrics that were the subjection of the comparison at function 106, then the desired metrics would be modified at function 116. Otherwise, it would be determined, at function 118, whether any desired operation characteristics had changed. This could result, from, inter alia, operational performance changes approved by a production engineer or requested by the end use of the DUTs 20 tested by the testing systems 11-15 that produced the event notification at function 100. If there were no desired operational characteristic changes, then a failure report would be generated at function 120. The failure report may be expressed in any suitable form for appropriate process, hardcopy, computer-readable copy, optical copy and the like. For example, the failure report may be rendered for processing by DSS 16, the testing system 11-15 that generated the failure report, the operator running the test system 11-15, and/or any other testing system 11-15 included in TMS 10. In short, the failure report may be used in any manner desired for further processing and analysis of the AOCs of DUTs 20. Otherwise, at function 122, it is determined whether any of the associated desired metrics should be modified in view of the changed operational characteristics. Unless a previous change had been undertaken for the desired operational characteristics, the operation would proceed to function 124; otherwise, the operation would end at function 120. At function 124, desired metrics are modified to compensate for the changed operational characteristics of DUTs 20. Following, each of functions 124 and 116, the operation continues to function 108 and progresses therefrom as described above until either a report is generated at either function 110 or function 120.

Although exemplary embodiments have been described, various modifications can be made without departing from the spirit and/or scope of the present invention. Therefore, the present invention should not be construed as being limited to the specific forms shown in the drawings and described above.

What is claimed is:

1. A distributed test system for electrical devices, said system comprising:
   a plurality of testing systems, each of which is configured to operate software to provide electrical stimuli to a device under test (DUT) and obtain measured metrics indicative of actual operational characteristics (AOC) of said DUT; and
   a decision support system (DSS) selectively placed in data communication with said plurality of testing systems to receive said measured metrics from said plurality of testing systems, said DSS being configured to operate on software and compare desired metrics indicative of desired operational characteristics (DOC) of each of said DUTs, wherein the DSS is operable to use said measured metrics to produce a plurality of operational characteristic determinations (OCDs), the DSS further configured to modify desired metrics associated with unacceptable OCDs to normalize measured metrics from different testing systems to compensate for environmental circumstances of the different testing systems.

2. The system as recited in claim 1 wherein a sub-group of said plurality of testing systems is operable to generate additional measured metrics (AMMs), with said DSS being further configured to vary said desired metrics while the test systems of said sub-group generate said AMMs.

3. The system as recited in claim 1 wherein said plurality of testing systems is operable to transmit to said DSS measured metrics in response to a particular event.

4. The system as recited in claim 1 wherein said DSS is operable to transmit a request to said plurality of testing systems to provide measured metrics to said DSS in response to the occurrence of a particular event.

5. The system as recited in claim 1 wherein said DSS is configured to transmit a signal to a sub-group of said plurality of testing systems to cause a physically perceivable stimuli proximate to the testing systems of said sub-group, with said signal being in response to comparing a first sub-portion of said OCDs with a second sub-portion of said OCDs.

6. The system as recited in claim 1 wherein said DSS is operable to vary desired metrics for a subset of said plurality of operational characteristic determinations.

7. The system as recited in claim 1 wherein said DSS is operable to vary desired metrics for a subset of said plurality of operational characteristic determinations based upon a comparison of the operational characteristic determinations of said subset with the remaining operational characteristic determinations of said plurality of operational characteristic determinations.

8. The system as recited in claim 1 wherein said DSS is operable to vary desired metrics for a subset of said plurality of operational characteristic determinations while the testing systems generate additional measured metrics.

9. The system as recited in claim 1 wherein said DSS is configured to vary desired metrics to define varied desired metrics (VDMs) when obtaining OCDs with respect to a subset of said measured metrics associated with the sub-group of said plurality of testing systems having known operational variations, with a difference between said desired metrics and said VDMs corresponding to said operational variations.

10. A distributed test method for electrical devices, said method comprising:
receiving, at a decision support system (DSS), measured metrics of a plurality of devices under test (DUTs), wherein said measured metrics are indicative of actual operational characteristics (AOC) of said plurality of DUTs;
generating operational characteristic determinations (OCDs) for said plurality of DUTs by comparing desired metrics, wherein the OCDs are indicative of desired operational characteristics (DOC) of each of said plurality of DUTs and stored on said DSS, wherein said measured metrics are used to,
determine whether the OCDs are acceptable; and
modify desired metrics associated with the unacceptable OCDs, thereby normalizing measured metrics from different testing systems to compensate for environmental circumstances of the different testing systems.

11. The method as recited in claim 10 wherein said measured metrics are generated by a plurality of testing systems, wherein said generating further includes producing said OCDs while said plurality of testing systems are generating additional measured metrics (AMMs).

12. The method as recited in claim 10 wherein said measured metrics are generated by a plurality of testing systems, and wherein the modifying occurs while said plurality of testing systems are generating additional measured metrics (AMMs).

13. The method as recited in claim 10 further including transmitting, from said DSS, a request to a plurality of testing systems to provide said measured metrics to said DSS in response to the occurrence of a particular event and sending, from said plurality of testing systems, said measured metrics to said DSS in response to the particular event.

14. The method as recited in claim 10 further including transmitting a signal, from said DSS, to a sub-group of a plurality of testing systems to cause a physically perceivable stimuli proximate to the sub-group, with said signal being in response to comparing a first sub-portion of said OCDs with a second sub-portion of said OCDs.

15. The method as recited in claim 10 wherein the modifying is based on a comparison of the OCDs of a subset of said plurality of OCDs with the remaining OCDs of said plurality of OCDs.

16. The method as recited in claim 10 wherein the modifying includes defining varied desired metrics (VDMs) when obtaining OCDs with respect to a subset of said measured metrics associated with a sub-group of a plurality of testing systems having known operational variations, wherein said known operational variations are differences between said desired metrics and said VDMs.

17. A distributed test method for electrical devices, said method comprising:
receiving, at a decision support system (DSS), measured metrics of a plurality of devices under test (DUTs), wherein said measured metrics are indicative of actual operational characteristics (AOC) of said plurality of DUTs;
generating, with a plurality of testing systems, operational characteristic determinations (OCDs) for said plurality of DUTs by comparing desired metrics, wherein the OCDs are indicative of desired operational characteristics (DOC) of said plurality of DUTs and stored on said DSS; and
producing a plurality of additional measured metrics (AMMs), while said DSS varies said desired metrics, said varied desired metrics associated with unacceptable OCDs, thereby normalizing measured metrics from different testing systems to compensate for environmental circumstances of the different testing systems.

18. The method as recited in claim 17 further including transmitting, from said DSS, a request to said plurality of testing systems to provide said measured metrics to said DSS in response to the occurrence of a predetermined event and sending, from said plurality of testing systems, said measured metrics to said DSS in response to said predetermined event.

19. The method as recited in claim 17 further including transmitting a signal, from said DSS, to a sub-group of said plurality of testing systems to cause a physically perceivable stimuli proximate to the testing systems of said sub-group, with said signal being in response to comparing a first sub-portion of said OCDs with a second sub-portion of said OCDs.

20. The method as recited in claim 17 wherein producing further includes varying, with said DSS, desired metrics, defining varied desired metrics (VDMs), with a sub-group of said plurality of testing systems having known operational variations, a difference between said desired metrics and said VDMs corresponding to said operational variations.

* * * * *